United States Patent [19]
Toh et al.

[11] Patent Number: 5,633,102
[45] Date of Patent: May 27, 1997

[54] LITHOGRAPHY USING A NEW PHASE-SHIFTING RETICLE

[75] Inventors: Kenny K. H. Toh, Sunnyvale; Giang T. Dao, Fremont; Eng T. Gaw, San Jose; Rajeev R. Singh, Santa Clara, all of Calif.

[73] Assignee: Intel Corporation, Santa Clara, Calif.

[21] Appl. No.: 396,926

[22] Filed: Mar. 1, 1995

Related U.S. Application Data

[63] Continuation of Ser. No. 81,854, Jun. 23, 1993, abandoned, which is a continuation of Ser. No. 748,848, Aug. 23, 1991, abandoned.

[51] Int. Cl.$^6$ .................................................. G03F 9/00
[52] U.S. Cl. .................. 430/5; 430/320; 430/321
[58] Field of Search ...................... 430/5, 320, 321

[56] References Cited

U.S. PATENT DOCUMENTS

| | | | |
|---|---|---|---|
| 4,890,309 | 12/1989 | Smith et al. | 378/35 |
| 5,045,417 | 9/1991 | Okamoto | 430/5 |
| 5,229,255 | 7/1993 | White | 430/311 |

FOREIGN PATENT DOCUMENTS

| | | |
|---|---|---|
| 0 090 924 | 2/1983 | European Pat. Off. . |
| 0 395 425 | 4/1990 | European Pat. Off. . |
| 63295350 | 5/1990 | Japan . |

OTHER PUBLICATIONS

"Transparent Phase–Shift Mask," The 51st Applied Physics Institue Lecture Conference, Autumn season, Sep. 26, 1990, JSAP Catalog No. AP901125–02, and English translation thereof, 2 pages.

N. Hasegawa, A. Imai, T. Terasawa, T. Tanaka, F. Murai. *The Japan Society of Applied Physics and Related Societies* "Extended Abstracts 29p–ZC–2, Submicron Litography Using Phase Mask (9): Halftone Phase Shifting Mask" and an English translation. Spring, 1991.

Watanabe, et al.; "Transparent Phase Shifting Mask"; *IEDM*; 1990; pp. 821–824.

Watanabe, et al.; "Transparent Phase Shift Mask"; Extended Abstracts (*The 51st Autumn Meeting* 1990); The Japan Society of Applied Physics 1990.

*Primary Examiner*—Mark Chapman
*Attorney, Agent, or Firm*—Blakely, Sokoloff, Taylor & Zafman

[57] ABSTRACT

Methods of forming a patterned layer using a reticle having a phase-shifting element and the reticles for making the patterns are disclosed. The methods of the present invention use a phase-shifting element to change the phase of the radiation exiting a reticle about 180° out of phase compared to the radiation exiting the areas immediately adjacent to an edge of the phase-shifting element so that radiation from both areas near the edge destructively interfere with each other so as to cancel out one another thereby resulting in a substantially unexposed region on a semiconductor substrate. The present invention can be used to prevent exposing a large area by using a set of phase-shifting elements to form a grating or checkerboard area.

22 Claims, 10 Drawing Sheets

LITHOGRAPHY USING A NEW PHASE-SHIFTING RETICLE

This is a continuation of application Ser. No. 08/081,854, filed Jun. 23, 1993 now abandoned, which is a continuation of application Ser. No. 07/748,848, filed Aug. 23, 1991 now abandoned.

FIELD OF THE INVENTION

The present invention relates generally to the field of printing lithographic patterns on a substrate and specifically to a method using a reticle having an area with a phase-shifting element to print a lithographic pattern used in the formation of a semiconductor device.

BACKGROUND OF THE INVENTION

Within the semiconductor industry, lithographic printers with reticles (also called masks) having device patterns have been used to pattern photoresist layers for several years. A reticle typically is a glass plate with chrome elements on the plate used to define a pattern. The chrome elements are opaque to the radiation source used in the lithographic printer. The radiation source generates a sinusoidal wave having a specific wavelength. A discussion of lithographic printing and the diffraction limitations of lithographic printing appears on pages 274–276 of *VLSI Technology* edited by S.M. Sze (©1983), which is herein incorporated by reference and hereinafter referred to as Sze. Resolution is a measure of how small of an image that can be patterned with a given set of optical parameters. Depth of focus is a measure of the vertical distance over which an image can be printed. Formulas for calculating resolution and depth of focus appear on page 276 of Sze.

Ideally, a very small resolution and a depth of focus at least as deep as the thickness of the photoresist layer are desired. As can be seen by the equations in Sze, the resolution and depth of focus are both affected by changing the wavelength of the radiation used or the numerical aperture of the lens within the lithographic printer. Therefore, smaller resolution can be achieved by lowering the wavelength or increasing the numerical aperture, but the smaller resolution is typically at the expense of the depth of focus.

In recent years, semiconductor devices have been characterized by the miniaturization of circuits and the spaces between the circuits used to form the devices. When a dimension of the pattern to be printed during lithography is smaller than the resolution, the pattern formed in the photoresist layer is distorted by diffraction. The prior art problem of diffraction limitations is disclosed in Japanese Patent Application Number 63-295350 by Okamoto, which is herein incorporated by reference and hereinafter referred to as Okamoto. FIG. 18 of Okamoto illustrates the light intensity when the dimensions of a chrome element and spaces on opposite sides of the chrome element are smaller than the resolution. The light intensity at the surface of the wafer is distorted from the square wave pattern achieved immediately after the light has passed through the reticle.

A prior art attempt to print a small dimensional pattern is to use chrome elements in conjunction with phase-shifting elements. FIG. 19 of Okamoto teaches a common example chrome used with phase shifters. A phase-shifting element is placed over alternate spaces between chrome elements. The phase-shifting element shifts the phase of the light about 180° out of phase compared to the adjacent space. The radiation from the space with the phase-shifting element destructively interferes with the light from the space without the phase-shifting element. The light intensity at the surface of the wafer is closer to the desired intensity pattern than the light intensity of FIG. 18. The reticle used in FIG. 19 uses both an opaque material and a phase-shifting material, which makes manufacture the reticle more complicated and requires additional manufacturing steps.

SUMMARY OF THE INVENTION

In view of the foregoing, one object of the present invention is to form a sub-micron photoresist pattern using a currently available radiation source.

Another object of the invention is to form a sub-micron photoresist pattern without creating other problems including a shallower depth of focus.

It is still another object of the present invention to form a reticle using phase-shifting material without using a material inherently opaque to the radiation source.

It is yet another object of the present invention to form a sub-micron photoresist pattern while maintaining a reliable and uncomplicated processing sequence.

The present invention uses a lithographic printer (contact, proximity, projection, x-ray, electron beam, etc.) with a readily available radiation source to form a patterned photoresist layer having dimensions smaller than 0.6 μm. The smaller pattern does not have the diffraction-related problems that occur when using a reticle including small chrome elements and small spaces between the chrome elements.

A photoresist layer is coated over the surface of a substrate. The substrate and a reticle including a phase-shifting element are placed into a lithographic printer. The reticle is disposed between the substrate and a radiation source within the lithographic printer. The reticle is irradiated using the lithographic printer's radiation source that operates at a predetermined wavelength. The radiation that exits the reticle in areas near the edge of a phase-shifting element destructively interfere with each other so as to cancel one another out preventing radiation within these areas from exposing an underlying photoresist layer. A region away from the edge does not have significant destructive interference, thereby exposing a portion of the underlying photoresist layer. A set of phase-shifting elements in the form of a grating or checkerboard pattern is used to substantially prevent exposure of a large region within the photoresist layer. The present invention can form a complicated pattern using a reticle without any opaque elements.

Objects, features, and advantages of the present invention will be apparent from the accompanying drawings and from the detailed description that follows.

DETAILED DESCRIPTION OF THE PRESENT INVENTION

The present invention forms a patterned layer having its smallest dimension about 0.3 µm or smaller in width. The currently preferred embodiment describes a method of using a lithographic printer operating at a predetermined wavelength with a reticle having a phase-shifting element to form a 0.3 µm pattern within a photoresist layer. The present invention may be used to form larger patterns as described below.

Figure 1:
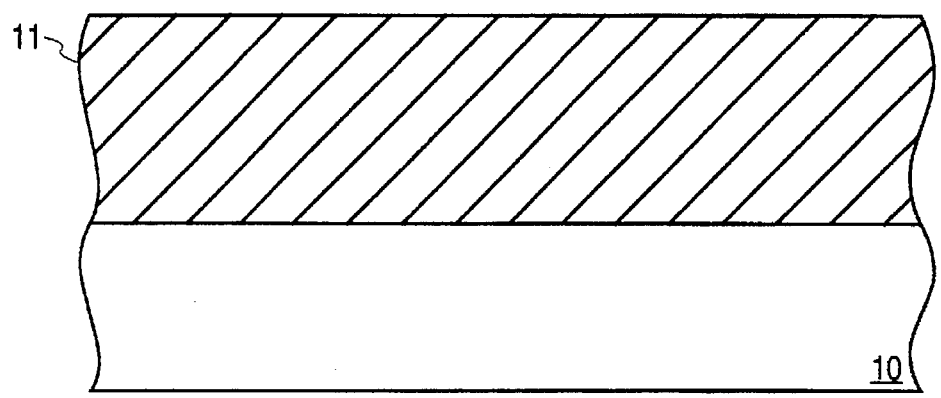
FIG. 1 is a cross sectional view of a portion of a substrate after coating the substrate with a photoresist layer.

A semiconductor substrate 10 is deposited with about 1 µm of a positive photoresist layer 11 as shown in FIG. 1. Other types of the photoresist materials, such as negative photoresist, may be used. The photoresist material must be sensitive to the wavelength of the radiation source that will be used. The substrate 10 is then placed in a lithographic printer having a radiation source and a reticle disposed between the radiation source and the substrate. An example of such a lithographic printer is a Nikon i-line projection printer that operates at a wavelength of about 365 nm and a lens with a numerical aperture (NA) of about 0.54 and a 5×1 image reduction factor. The 5×1 image reduction factor means that an image on the reticle is reduced by about five times when the image reaches the substrate. The lens is disposed between the reticle and the substrate.

Figure 2A:
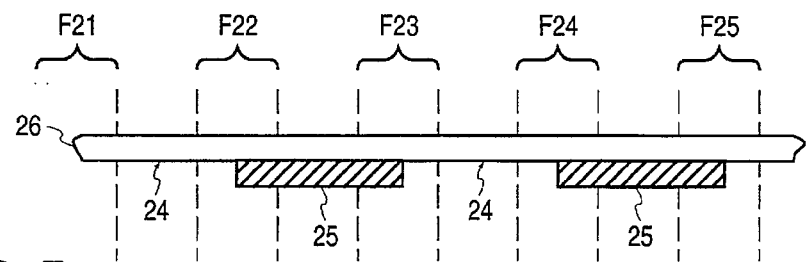
FIG. 2A is an illustration of a reticle including phase-shifting elements in accordance with the currently preferred embodiment.

The reticle has spaced-apart phase-shifting elements 25 with transparent areas 24 between the spaced-apart elements 25 as shown in FIG. 2A. The reticle has a base 26, which is comprised of glass. The phase-shifting elements 25 are comprised of silicon dioxide and protrude downward from the base 26. Each phase-shifting element 25 is approximately 3.0 µm wide and about 397 nm thick. The phase-shifting elements are separated by about 3.0 µm. When the reticle is irradiated, the wave pattern of the radiation exiting a phase-shifting element 25 is shifted about 180° out of phase relative to the wave pattern of the radiation exiting a transparent area 24. Small fields are formed in which the radiation from the phase-shifting element 25 destructively interferes with the radiation from the transparent area 24.

Figure 2B:
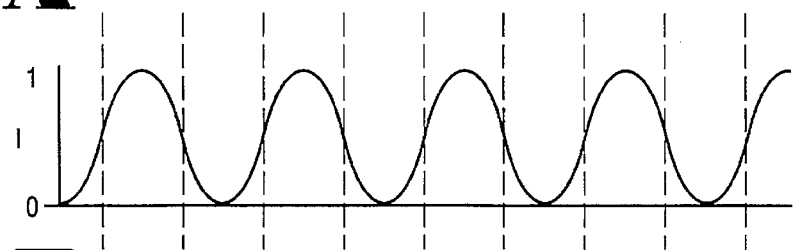
FIG. 2B is a normalized plot of the radiation intensity incident on the photoresist layer.
Figure 2C:
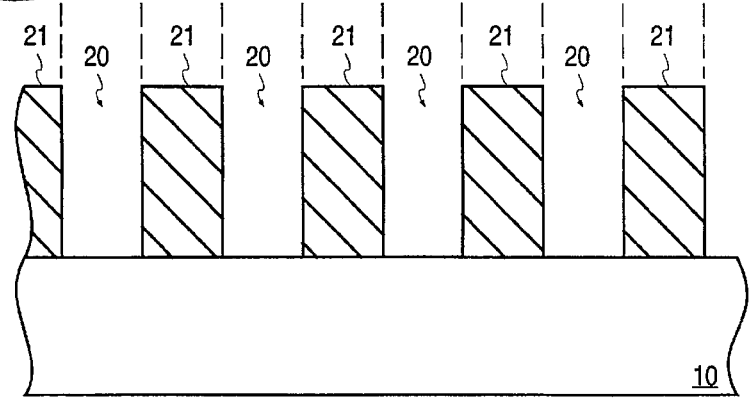
FIG. 2C depicts the substrate of FIG. 1 after forming a pattern in the photoresist layer using the reticle of FIG. 2A in accordance with the currently preferred embodiment.

These fields are illustrated as F21, F22, F23, F24, and F25 in FIG. 2A, 2B, and 2C.

Figure 2D:
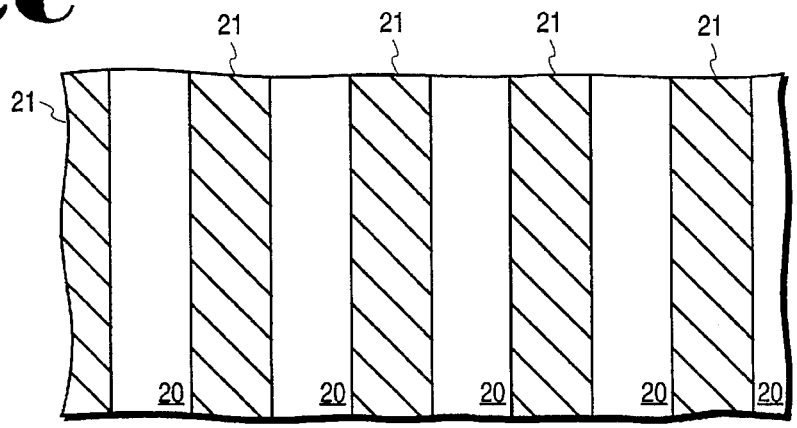
FIG. 2D shows an aerial view of the substrate in FIG. 2C.

The pattern is projected unto the substrate giving an intensity profile of the radiation at the substrate surface as shown in FIG. 2B. The y-axis of FIG. 2B is a normalized scale for the amount of radiation incident on the wafer. An intensity of 1 corresponds to the highest level of radiation incident on the surface of the photoresist layer. An intensity of 0 means that no radiation is incident on the surface of the photoresist layer. Destructive interference fields F21, F22, F23, F24, and F25 have nearly zero intensity near the middle of each field due to destructive interference. The destructive interference prevents the underlying areas of the photoresist layer from becoming significantly exposed. The fields immediately adjacent to the destructive interference fields F21, F22, F23, F24, and F25 are not destructively interfered, thereby exposing strips within the photoresist layer. After the photoresist layer has been selectively exposed using the reticle of FIG. 2A, the photoresist layer is developed and baked resulting in a pattern as illustrated in FIG. 2C. The patterned photoresist layer has a pitch of about 0.6 µm that is equally divided to form lines 21 about 0.3 µm wide and spaces 20 about 0.3 µm wide. FIG. 2D is an aerial view of the pattern illustrated in FIG. 2C. Developing and baking photoresist layers are well known in the prior art.

Figure 3:
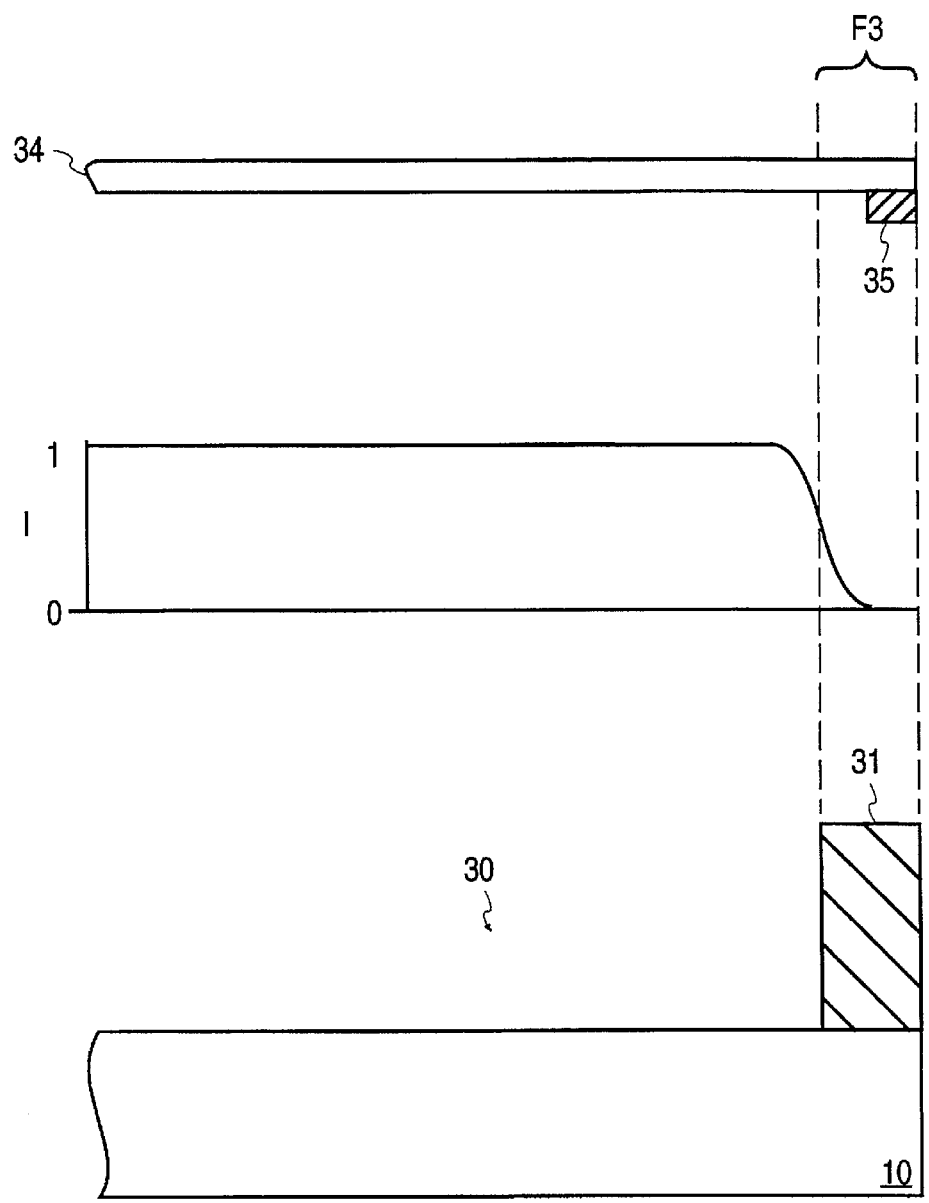
FIG. 3 is an illustration of a reticle including a phase-shifting element near an edge of the reticle, a radiation intensity plot, and the photoresist pattern formed by the reticle.
Figure 4:
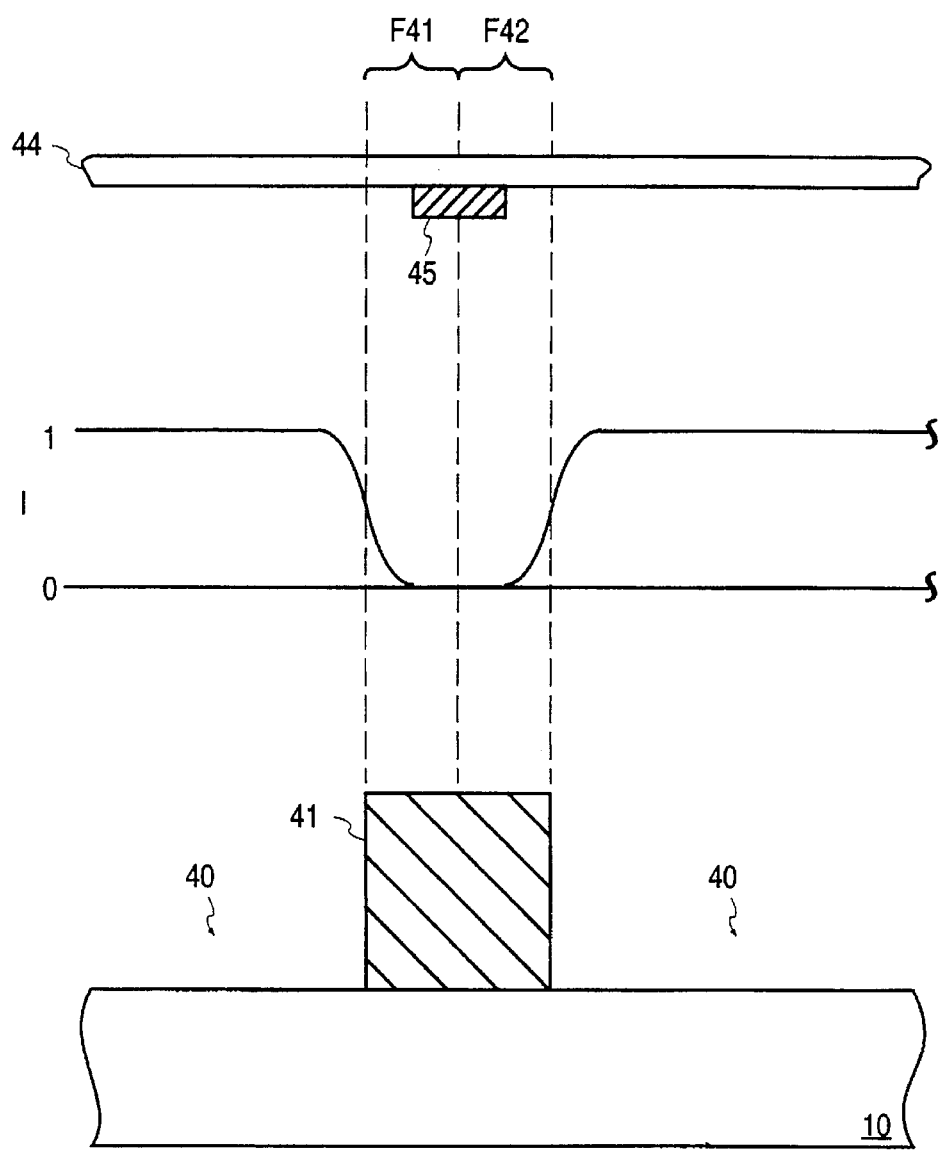
FIG. 4 is an illustration of a reticle including a phase-shifting element away from the edge of the reticle, a radiation intensity plot, and the photoresist pattern formed by the reticle.
Figure 5:
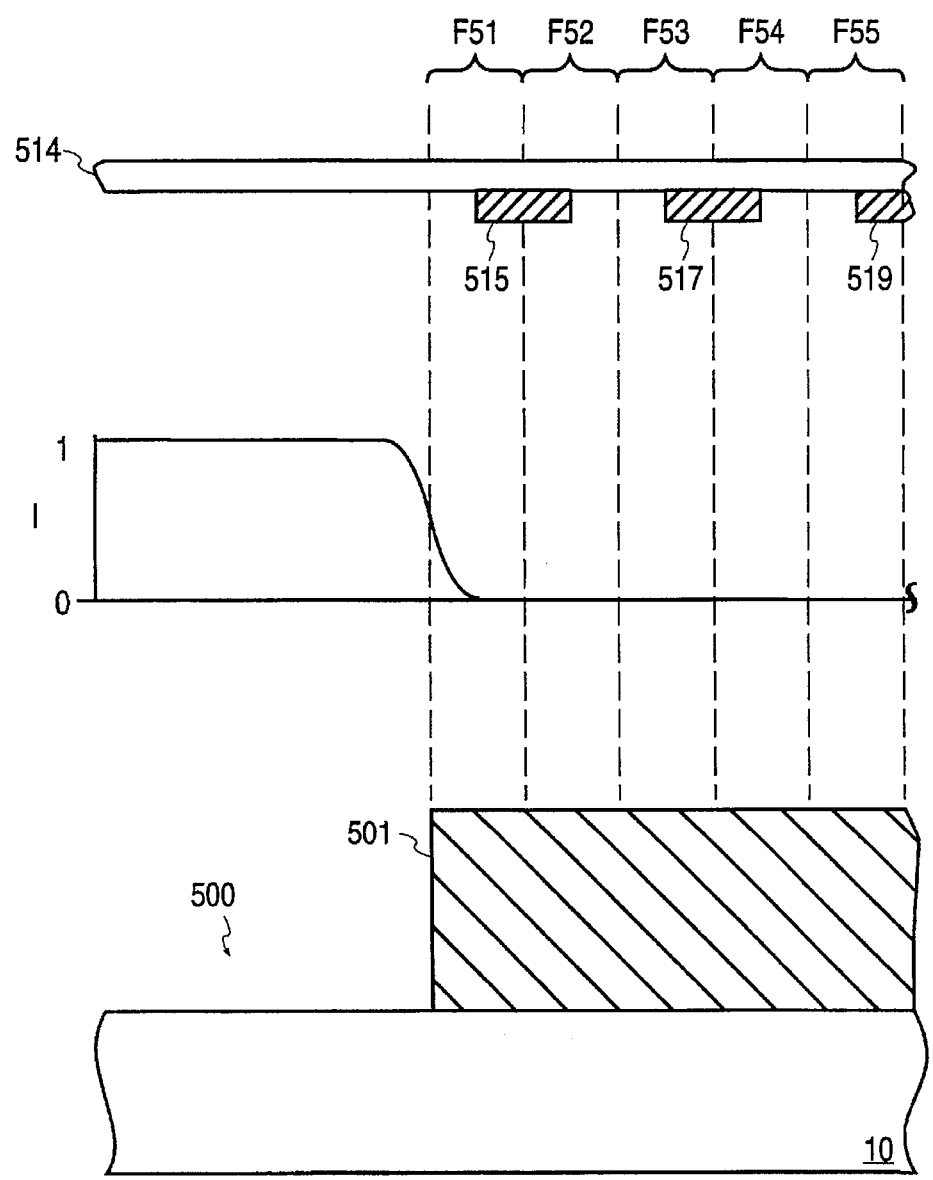
FIG. 5 is an illustration of a reticle including a set of phase-shifting elements which form a grating pattern, a radiation intensity plot, and the photoresist pattern formed by the reticle.

The options for other patterns are numerous. Several examples are presented to better illustrate patterns that can be produced using different phase-shifting element patterns. FIGS. 3, 4, and 5 are simpler patterns, and FIGS. 6, 7, 8, and 9 are more complicated patterns. All patterns in FIGS. 3–9 use the same type of photoresist layer (positive photoresist material about 1 µm thick) and lithographic printer as described in conjunction with FIG. 2. The lithographic printer has the same the radiation source operating at a wavelength of about 365 nm and the same lens having a numerical aperture of about 0.54 and a 5×1 image reduction factor.

FIG. 3 is an illustration of a reticle, an intensity profile of the radiation at the surface of a photoresist layer, and the pattern that is formed in a photoresist layer when using the reticle. The reticle has a single phase-shifting element 35 near an edge of the reticle's base 34. The phase-shifting element 35 is about 0.75 µm wide on the reticle. The radiation from both the phase-shifting element and the area immediately adjacent to the phase-shifting element destructively interfere with each other in the field F3 to give the intensity profile as shown in FIG. 3. After the substrate 10 with the photoresist layer is exposed using the reticle of FIG. 3, the photoresist layer is developed and baked to produce the patterned photoresist layer in FIG. 3 that has a photoresist element 31 about 0.3 µm wide and an opening 30.

FIG. 4 has a phase-shifting element 45 about 1.5 µm wide on the reticle is located away from the edge of the reticle's base 44. Destructive interference fields F51 and F52, which are immediately adjacent to one another, are formed when the reticle is irradiated. The resulting intensity profile of the radiation at the photoresist layer surface is shown in FIG. 4. The destructive interference fields F41 and F42 produce an unexposed region within the photoresist layer. After developing and baking the photoresist layer, the substrate has a photoresist element 41 about 0.3 µm wide and openings 40 on the opposite sides of the photoresist element 41.

FIG. 5 has a set of spaced-apart phase-shifting elements 515, 517, and 519 on the reticle's base 514. Each element is about 0.75 µm wide and separated by about 0.75 µm. The set of phase-shifting elements forms a grating to produce a set of destructive interference fields F51, F52, F53, F54, and F55. Each field is immediately adjacent to at least one of the other fields which gives an intensity profile of the radiation at the photoresist layer surface as shown in FIG. 5. The fields combine to form one large substantially unexposed region within the photoresist layer. After developing the photoresist layer, the substrate has a photoresist element 501 and an opening 500 as shown in FIG. 5.

FIGS. 6, 7, 8, and 9 illustrate three examples of more complicated applications using phase-shifting reticles. FIG. 6A is a reticle having a checkerboard pattern. Transparent sections and phase-shifting elements are both square and generally indicated as areas 65 and 66, respectively. The transparent sections 65 and phase-shifting elements 66 each have an area that is about the same and have a dimension of about 3.0 μm on a side on the reticle. The image formed within the photoresist layer is generally shown by FIG. 6B and includes unexposed regions 61 about 0.3 μm in diameter. The balance of the photoresist layer is exposed and is illustrated as region 60.

Figure 7A:
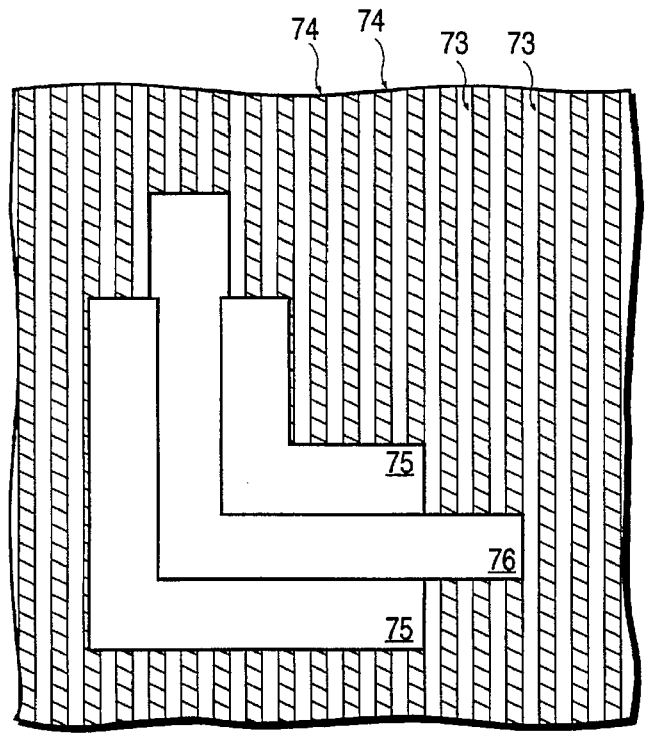
FIG. 7A is an illustration of a reticle using grating areas and non-grating areas used to form a set of "L" bars.
Figure 7B:
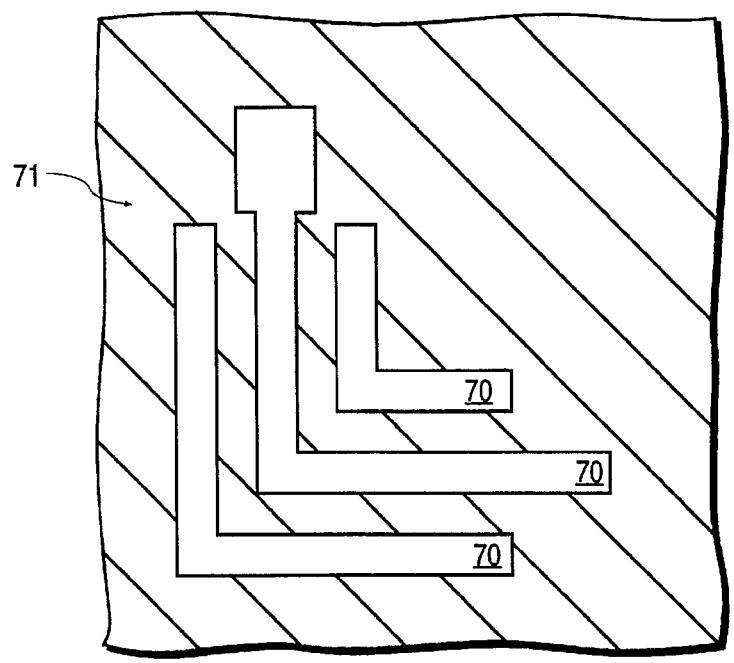
FIG. 7B shows an aerial view of a patterned photoresist layer formed when using the reticle of FIG. 7A.

FIG. 7A is an illustration of a grating used over a large area of the reticle. The basic concept of grating to block radiation is discussed in conjunction with FIG. 5. Referring to FIG. 7A, the grating area has phase-shifting elements 74 and spaces 73 that are each about 0.8 μm wide. The grating area prevents substantially all of the radiation from reaching the photoresist layer under the grating pattern. Only the large opens areas 75 and a large phase-shifting element 76 allow some radiation to reach the photoresist layer. FIG. 7B is an aerial image of a patterned photoresist layer formed by the reticle in FIG. 7A. The exposed regions 70 form "L" bars surrounded by unexposed areas 71, wherein the width of the L bars is about 0.4 μm and are separated by about 0.4 μm.

Figure 8A:
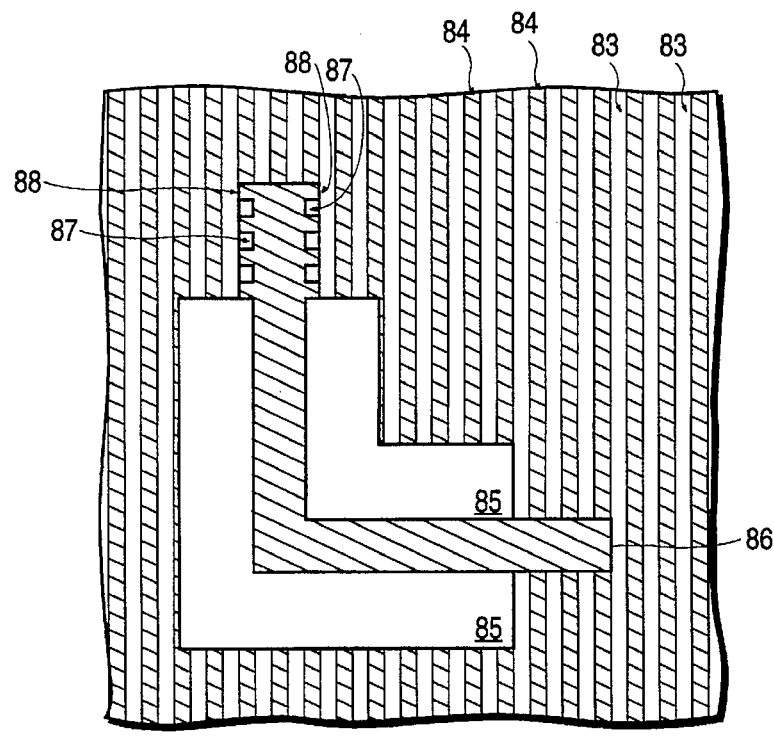
FIG. 8A is an illustration of a reticle using grating and checkerboard areas used to form a set of "L" bars.
Figure 8B:
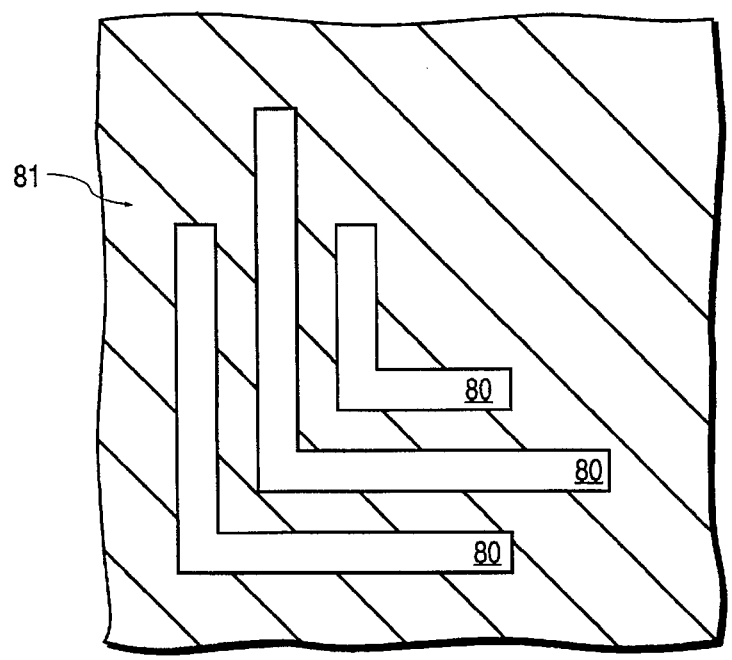
FIG. 8B shows an aerial view of a patterned photoresist layer formed when using the reticle of FIG. 8A.

The reticle of FIG. 7A produces a "head" on the center L bar of the photoresist layer in FIG. 7B. In order to produce the center L bar without the head, FIG. 8A is an illustration of a reticle including checkerboard squares to provide additional destructive interference within the isolated areas of the head. The grating area has phase-shifting elements 84 and spaces 83 that are each about 0.8 μm wide. Large opens areas 85 and a large phase-shifting element 86 allow some radiation to reach the photoresist layer. In the areas adjacent to the upper portion of the phase-shifting element 86 are a set of phase-shifting squares 88 with openings 87 between the squares. The squares are about 0.8 μm on a side and are separated from one another by about 0.8 μm. The combination of the grating areas and checkerboard squares provide exposed L bars 80 without a head and unexposed regions 81 as shown in FIG. 8B. The L bars 80 have a width of about 0.4 μm and are separated by about 0.4 μm.

Figure 9A:
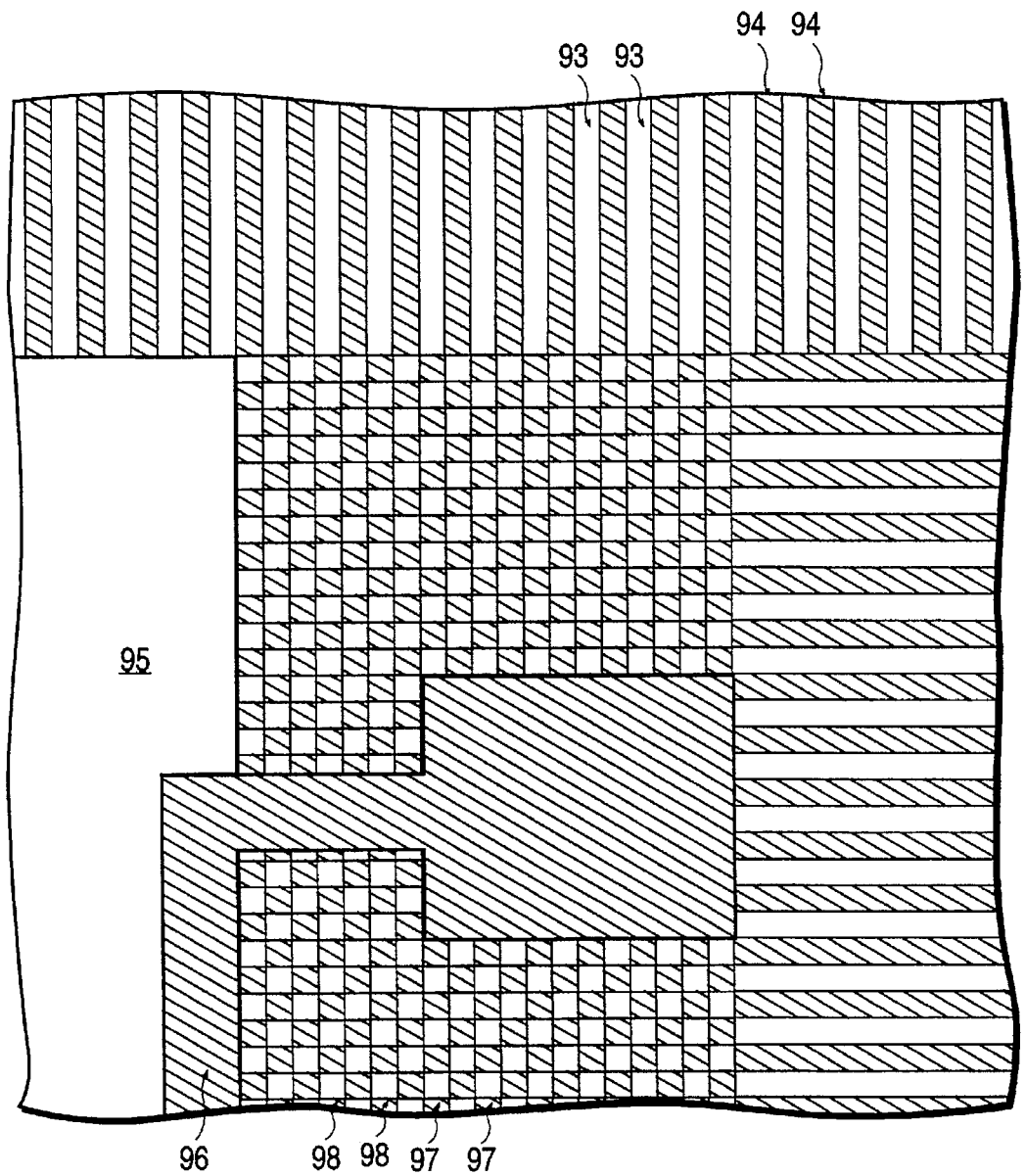
FIG. 9A is an illustration of a reticle having an alternate embodiment using grating and checkerboard areas over large areas of the reticle.
Figure 9B:
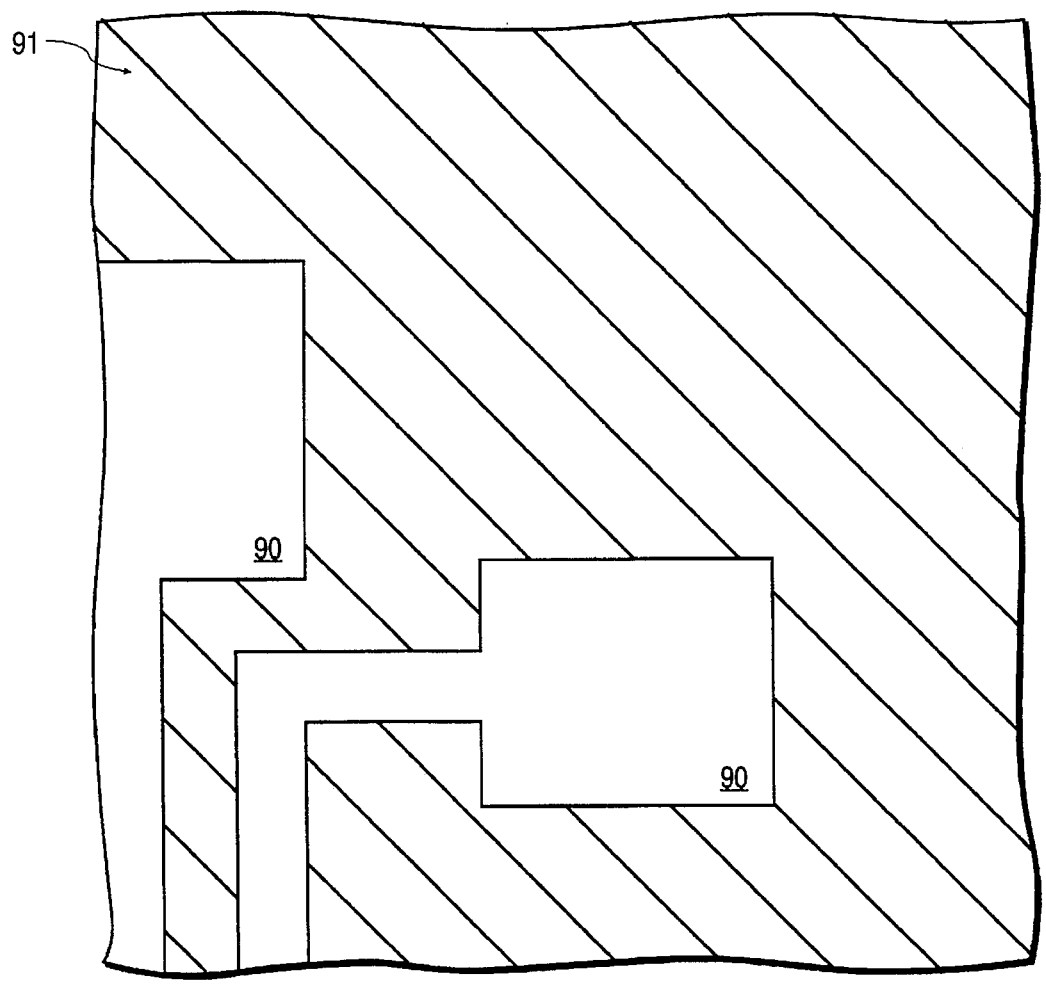
FIG. 9B shows an aerial view of a patterned photoresist layer formed when using the reticle of FIG. 9A.

FIG. 9A is a reticle using both grating and checkerboard patterns to prevent radiation from reaching the photoresist layer. The grating has phase-shifting elements 94 and spaces 93 about 0.8 μm wide. The checkerboard has alternating squares having phase-shifting elements 98 and spaces 97. Every square has about the same area and each has a dimension of about 0.8 m on a side. The grating and checkerboard areas are used to prevents substantially all of the radiation from reaching large regions within the photoresist layer. Phase-shifting element 96 and area 95 allow radiation to pass in areas away from the phase-shifting element edges to form exposed regions 90 and unexposed regions 91 as shown in FIG. 9B.

The foregoing provides specific examples of reticles and photoresist patterns produced by the reticles when using a radiation source operating at about 365 nm, a lens having a numerical aperture of about 0.54 and an image reduction factor of 5×1. The examples are given to illustrate some patterning options and are not intended to limit the scope or spirit of the present invention. The present invention may be used at any specific wavelength, with any numerical aperture, and with any image reduction factor. Commercially available lithographic printers typically have a radiation source operating at a wavelength no longer than about 436 nm and a lens with a numerical aperture between about 0.17 and about 0.54 and a image reduction factor between about 1×1 and about 10×1.

The pattern of phase-shifting elements are best describes when starting from large dimensional patterns and working to small dimensional patterns. All dimensions are stated in units of IRF·λ/NA, wherein IRF is the image reduction factor, λ is the wavelength of the radiation source, and NA is the numerical aperture of the lens. Dimensions are stated in units of IRF·λ/NA because the present invention is not limited by the image reduction factor, radiation wavelength, or the numerical aperture.

When a phase-shifting element or an opening between phase-shifting elements has a width greater than 1.2 IRF·λ/NA, there is destructive interference at the edge of the phase-shifting element or the opening. For example, a reticle may have a pattern including a large phase-shifting element (>1.2 IRF·λ/NA) surrounded by a large open area (>1.2 IRF·λ/NA) or a large opening (>1.2 IRF·λ/NA) surrounded by a large phase-shifting element (>1.2 IRF·λ/NA). The photoresist layer is not exposed at the edge of the large phase-shifting element or the large opening, but the photoresist layer is exposed away from the edge. A practical application may be to form a guard ring around a structure within a device.

Figure 6A:
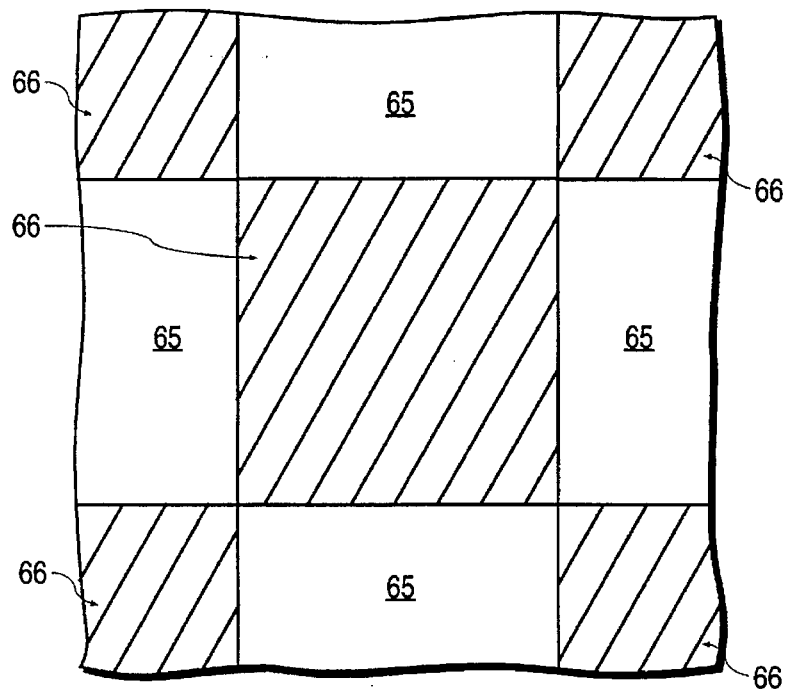
FIG. 6A is an illustration of a reticle used to form isolated exposed areas.
Figure 6B:
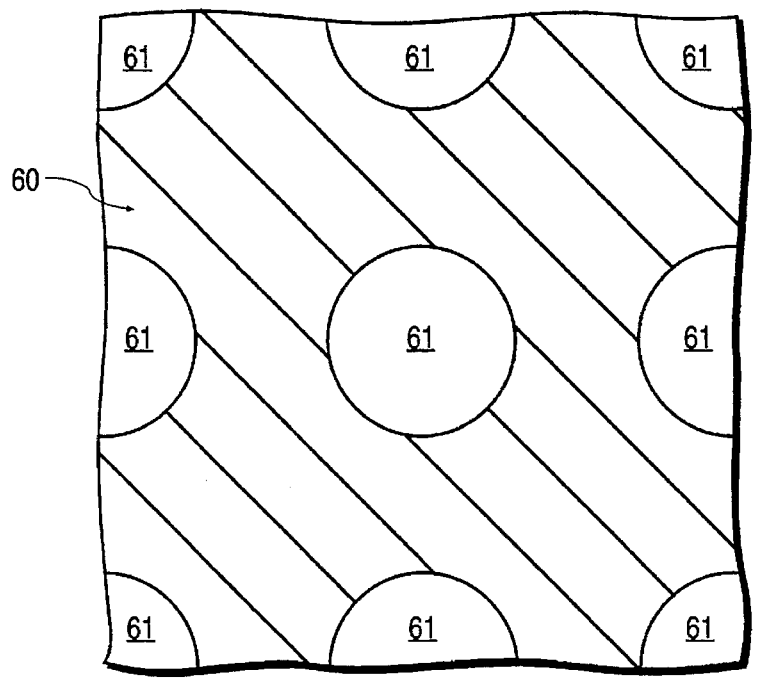
FIG. 6B shows an aerial view of a patterned photoresist layer formed when using the reticle of FIG. 6A.

When a reticle pattern has spaced-apart phase-shifting elements and openings between the phase-shifting elements, wherein each element and each opening is between about 0.6 IRF·λ/NA and about 1.2 IRF·λ/NA, the photoresist pattern formed by the reticle has lines and spaces that are between about 0.3 λ/NA and about 0.6 λ/NA wide. FIGS. 2A–2D provide a good example of repeating lines and spaces. This application can be used to form a patterned photoresist layer used in patterning a polysilicon layer to form word lines within a memory array. FIGS. 6A and 6B is another example, wherein a set of closely spaced contact openings are formed within the photoresist layer.

An isolated unexposed region within a photoresist layer can be formed by a reticle having an isolated phase-shifting element with a width no greater than about 0.4 IRF·λ/NA surrounded by a large open area (>1.2 IRF·λ/NA) or having an isolated opening with a width no greater than about 0.4 IRF·λ/NA surrounded by a large phase-shifting element (>1.2 IRF·λ/NA). FIG. 4 provides a good example.

Large unexposed regions within a photoresist layer are formed by a reticle having a series of spaced-apart narrow phase-shifting elements and narrow openings between the phase-shifting elements. The width of each phase-shifting element and each opening is no greater than about 0.3 IRF·λ/NA. Preferably, the width of all phase-shifting elements and the width of all openings are about the same. FIGS. 7A and 7B uses a series of narrow phase-shifting bars to form a grating. FIGS. 9A and 9B use a combination of phase-shifting bars and a checkerboard pattern to for another grating. FIGS. 8A and 8B primarily use phase-shifting bars, but uses a checkerboard pattern in an isolated area to prevent the formation of a head on the center L bar within the photoresist layer. In any of these cases, a grating or checkerboard area is used to substantially prevent exposing a large region within a photoresist layer.

The options with the reticle's materials are numerous. The reticle base does not need to be comprised of glass. Other materials including silicon dioxide, silicon, silicon nitride, silicon oxynitride, boron nitride, etc. may be used as the reticle base. The phase-shifting element may be comprised of a material including photoresist, silicon dioxide, polyimide, silicon nitride, silicon oxynitride, and any combination thereof. The phase-shifting element may be placed on the bottom or top of the reticle, although greater pattern definition typically is achieved when the element is placed on the bottom of the reticle facing the photoresist layer.

The phase-shifting element must have a known index of refraction. The thickness of the phase-shifting element varies depending on the wavelength of the radiation source and the index of refraction for the phase-shifting material used. In general, the phase-shifting element's thickness is about $\lambda/2(\eta-1)$ where $\lambda$ is the wavelength of the radiation source and $\eta$ is the phase-shifting material's index of refraction.

The intensity of the radiation exiting a phase-shifting element of the reticle should be almost the same intensity of the radiation exiting an area immediately adjacent to the phase-shifting element to provide more thorough destructive interference within each destructive interference field. The phase-shifting element material should be selected so that the intensity is not significantly reduced.

The present invention may have two or more sets of phase-shifting elements on a reticle. In the case of two sets of phase-shifting elements, the radiation exiting the first set of elements is out of phase by about 180° relative to radiation exiting the second set of elements. For example, the radiation wave exiting the first set of elements may be at a phase angle of about 90°, and the radiation wave exiting the second set of elements may be at a phase angle of about 270°. The radiation from each set of elements within a destructive radiation field should cancel each other out because the radiation waves are about 180° out of phase relative to each other. The reticle uses the same types patterns as previously described except that first set of elements replace the original phase-shifting elements and the second set of elements replace the spaces between the original elements. The thickness difference between the two sets of elements should be about $\lambda/2(\eta-1)$ where $\lambda$ is the wavelength of the radiation source and $\eta$ is the phase-shifting material's index of refraction. The use of two sets of phase-shifting elements may solve the radiation intensity problem previously described.

The present invention may also be used with an opaque element. An opaque element may be used to pattern an area having width greater than about 0.6 $\lambda$/NA. In this manner, areas of the reticle have chrome elements used to print the larger regions within the photoresist layer and phase-shifting elements used to print the smaller regions within the photoresist layer. Unlike the prior art, the present invention does not use a combination of an opaque element on the reticle with a phase-shifting element on the reticle to print a single photoresist element or a single opening between photoresist elements.

The present invention allows sub-micron patterns within a photoresist layer to be formed using a readily available radiation source, wherein the width of the a photoresist element or opening between photoresist elements is as small as 0.3 μm wide or smaller. In general, the smallest dimension that can be resolved by the present invention is about 0.3 $\lambda$/NA. The depth of focus is not affected by the present invention. The formula for the depth of focus appears on page 276 of Sze. The present invention reticle can be made by depositing a phase-shifting layer on a reticle base and patterning the phase-shifting layer. Reticles are easier to form because they do not require any opaque materials, such as chrome. Therefore, the reticle is made with fewer processing steps. The present invention can form patterns in a photoresist layer that vary from isolated small dimensional patterns to repetitious line and space patterns (small or large dimensional) to very large exposed field patterns and very large dark field patterns. Nearly any conceivable photoresist pattern can be formed by the present invention.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

What is claimed is:

1. A reticle for use in patterning a radiation sensitive layer on a printer, said printer having a numerical aperture (NA), an image reduction factor (IRF), and a wavelength ($\lambda$) of exposing radiation, said reticle comprising:

at least one first region and at least one second region, said first and said second regions transmitting an approximately equal intensity of said radiation incident thereon, wherein said radiation transmitted through said first region is phase-shifted approximately 180° relative to said radiation transmitted through said second region;

a first area comprising one of said first regions between and adjacent to two of said second regions, wherein intensity of said radiation at the surface of said radiation sensitive layer is insufficient to substantially expose said radiation sensitive layer beneath portions of said first area approximately where said first region and said second regions are adjacent to one another due to destructive interference, and wherein said first region and said second regions in said first area have a width such that intensity of said radiation at the surface of said radiation sensitive layer is sufficient to substantially expose said radiation sensitive layer beneath center portions of said first region and said second regions in said first area.

2. The reticle as described in claim 1 wherein said first region and said second regions in said first area each have a width in the range of approximately 0.6 IRF *$\lambda$/NA through 1.2 IRF *$\lambda$/NA.

3. The reticle as described in claim 1 comprising a portion of said reticle having a device pattern thereon, wherein said portion has no opaque layer.

4. A reticle for use in patterning a radiation sensitive layer on a printer, said printer having a numerical aperture (NA), an image reduction factor (IRF), and a wavelength ($\lambda$) of exposing radiation, said reticle comprising:

at least one first region and at least one second region, said first and said second regions transmitting an approximately equal intensity of said radiation incident thereon, wherein said radiation transmitted through said first region is phase-shifted approximately 180° relative to said radiation transmitted through said second region:

a first area comprising one of said first regions between and adjacent to two of said second regions;

wherein said first region in said first area has a width of approximately 0.4 IRF *$\lambda$/NA or less, and wherein intensity of said radiation at the surface of said radiation sensitive layer is insufficient to substantially expose said radiation sensitive layer approximately beneath said first region in said first area due to destructive interference.

5. The reticle as described in claim 4 comprising a portion of said reticle having a device pattern thereon, wherein said portion has no opaque layer.

6. A reticle for use and patterning a radiation sensitive layer on a printer, said printer having a numerical aperture (NA), an image reduction factor (IRF), and a wavelength ($\lambda$) of exposing radiation, said reticle comprising:

a plurality of first regions and a plurality of second regions, said first and said second regions transmitting an approximately equal intensity of said radiation incident thereon, wherein said radiation transmitted through said first regions is phase-shifted approximately 180° relative to said radiation transmitted through said second regions;

a first area, having a pattern comprising said plurality of first regions and said plurality of second regions, said pattern such that intensity of said radiation at the surface of said radiation sensitive layer is insufficient to substantially expose said radiation sensitive layer beneath said first area due to destructive interference between said radiation transmitted through said first regions and said radiation transmitted through said second regions.

7. The reticle as described in claim 6 comprising a portion of said reticle having a device pattern thereon, wherein said portion has no opaque layer.

8. The reticle as described in claim 6 wherein said pattern is selected from the group consisting of a grating pattern, a checkerboard pattern, and a combination thereof.

9. The reticle as described in claim 8 wherein said first and said second regions in said first area are spaced at a distance no greater than approximately 0.3 IRF *$\lambda$/NA.

10. The reticle as described in claim 6 wherein said first and said second regions in said first area are spaced at a distance no greater than approximately 0.3 IRF *$\lambda$/NA.

11. A method of patterning a radiation sensitive layer on a substrate comprising:

depositing said radiation sensitive layer on said substrate;

exposing a first region and two second regions of said radiation sensitive layer using a printer having a numerical aperture (NA), an image reduction factor (IRF), and a wavelength ($\lambda$) of exposing radiation, said first region being between and adjacent to said second regions, wherein said radiation is of approximately equal intensity in said first and said second regions, wherein said radiation in said first region is phase-shifted approximately 180° relative to said radiation in said second regions, such that said radiation in said first region destructively interferes with said radiation in said second regions, such that said radiation sensitive layer is not substantially exposed at least where said first region is adjacent to said second regions, and wherein said first region and said second regions have a width such that intensity of said radiation in center portions of said first and said second regions is sufficient to substantially expose said center portions of said first and said second regions.

12. The method as described in claim 11 wherein said first region and said second region each have a width in the range of approximately 0.6 IRF*$\lambda$/NA through 1.2 IRF*$\lambda$/NA.

13. A method of patterning a radiation sensitive layer on a substrate comprising:

depositing said radiation sensitive layer on said substrate;

exposing a first region and two second regions of said radiation sensitive layer using a printer having a numerical aperture (NA), an image reduction factor (IRF), and a wavelength ($\lambda$) of exposing radiation, said first region being between and adjacent to said second regions, wherein said radiation is of approximately equal intensity in said first and said second regions, wherein said radiation in said first region is phase-shifted approximately 180° relative to said radiation in said second regions, such that said radiation in said first region destructively interferes with said radiation in said second regions, and wherein said first region has a width of approximately 0.4 IRF*$\lambda$/NA or less, such that intensity of said radiation in said first region is insufficient to substantially expose said first region due to destructive interference between said radiation in said first region and said radiation in said second regions.

14. A method for patterning of radiation sensitive layer on a substrate comprising:

depositing said radiation sensitive layer on said substrate;

exposing a plurality of first regions and the plurality of second regions of said radiation sensitive layer on a printer having a numerical aperture (NA), an image reduction factor (IRF) and a wavelength ($\lambda$) of exposing radiation, wherein said radiation is of approximately equal intensity in said first and said second regions, wherein said radiation in said first region is phase-shifted approximately 180° relative to said radiation in said second regions;

exposing a first area comprising a pattern of said first and said second regions, said pattern such that intensity of said radiation is insufficient to substantially expose said radiation sensitive layer in said first area due to destructive interference between said radiation in said first regions and said second regions of said pattern in said first area.

15. The method as described in claim 14 wherein said pattern is selected from the group consisting of a grating pattern, a checkerboard pattern, and a combination thereof.

16. The method as described in claim 15 wherein said first and said second regions in said first area are spaced at a distance no greater than approximately 0.3 IRF*$\lambda$/NA.

17. The method as described in claim 14 wherein said first and said second regions in said first area are spaced at a distance of no greater than approximately 0.3 IRF*$\lambda$/NA.

18. A reticle for use in patterning a radiation sensitive layer on a printer, said printer having a numerical aperture (NA), an image reduction factor (IRF), and a wavelength ($\lambda$) of exposing radiation, said reticle comprising:

at least one first region and at least one second region, said first region and said second regions transmitting an approximately equal intensity of said radiation incident thereon, wherein said radiation transmitted through said first region is phase-shifted approximately 180° relative to said radiation transmitted through said second region;

a first area comprising one of said first regions and one of said second regions, said first region being adjacent to said second region, wherein intensity of said radiation at the surface of said radiation sensitive layer is insufficient to substantially expose said radiation sensitive layer beneath portions of said first area approximately where said first region and said second region are adjacent to one another due to destructive interference, and wherein said first region and said second region in said first area have a width such that intensity of said radiation is sufficient to substantially expose said radiation sensitive layer beneath portions of said first region and second region disposed a distance from where said first region and said second region are adjacent to one another.

19. The reticle as described in claim 18 wherein said first region and said second region in said first area each have a width greater than approximately 1.2 IRF*$\lambda$/NA.

20. The reticle as described in claim 18 comprising a portion of said reticle having a device pattern thereon, wherein said portion has no opaque layer.

21. A method of patterning a radiation sensitive layer on a substrate comprising:

depositing said radiation sensitive layer on said substrate;

exposing a first region and a second region of said radiation sensitive layer using a printer having a numerical aperture (NA), an image reduction factor (IRF), and a wavelength ($\lambda$) of exposing radiation, said first region being adjacent to said second region, wherein said radiation is of approximately equal intensity in said first and second regions, wherein said radiation in said first region is phase-shifted approximately 180° relative to said radiation in said second region, such that said radiation in said first region destructively interferes with said radiation in said second region, such that said radiation sensitive layer is not substantially exposed where said first region is adjacent to said second regions, and wherein said first and said second region have a width such that intensity of said radiation is sufficient to substantially expose said radiation sensitive layer beneath portions of said first region and second region disposed a distance from where said first region and said second region are adjacent to one another.

22. The method as described in claim 21 wherein said first region and said second region in said first area each have a width greater than approximately 1.2 /IRF*$\lambda$/NA.

* * * * *